(12) United States Patent
Teng

(10) Patent No.: US 8,587,374 B2
(45) Date of Patent: Nov. 19, 2013

(54) AMPLIFIER ACTIVATION

(75) Inventor: Robert Hwat Hian Teng, Zurich (CH)

(73) Assignee: St-Ericsson SA, Plan-les-Ouates (CH)

( * ) Notice: Subject to any disclaimer, the term of this patent is extended or adjusted under 35 U.S.C. 154(b) by 42 days.

(21) Appl. No.: 13/504,710

(22) PCT Filed: Oct. 29, 2010

(86) PCT No.: PCT/EP2010/006619
§ 371 (c)(1),
(2), (4) Date: Apr. 27, 2012

(87) PCT Pub. No.: WO2011/050974
PCT Pub. Date: May 5, 2011

(65) Prior Publication Data
US 2012/0218043 A1 Aug. 30, 2012

(30) Foreign Application Priority Data

Oct. 30, 2009 (EP) ..................................... 09252519

(51) Int. Cl.
*H03F 1/36* (2006.01)
(52) U.S. Cl.
USPC ........................................ 330/84; 330/124 R
(58) Field of Classification Search
USPC ................... 330/84, 124 R, 95, 126
See application file for complete search history.

(56) References Cited

U.S. PATENT DOCUMENTS

| | | | |
|---|---|---|---|
| 3,982,196 A * | 9/1976 | Poujois | 330/9 |
| 4,494,077 A * | 1/1985 | Fukaya et al. | 330/295 |
| 6,657,487 B2 * | 12/2003 | Lauffenburger et al. | 330/9 |
| 7,639,075 B2 * | 12/2009 | Lin | 330/51 |
| 2008/0258809 A1 | 10/2008 | Yen | |
| 2009/0245541 A1 | 10/2009 | Wang | |

FOREIGN PATENT DOCUMENTS

WO 03075456 A1 9/2003

OTHER PUBLICATIONS

International Search Report issued in corresponding International application No. PCT/EP2010/006619, mailed Nov. 29, 2010.
Written Opinion issued in corresponding International application No. PCT/EP2010/006619, mailed Nov. 29, 2012.
European Search Report issued in corresponding European application No. 09 25 2519, completed Feb. 23, 2010.

* cited by examiner

*Primary Examiner* — Henry Choe
(74) *Attorney, Agent, or Firm* — Patent Portfolio Builders, PLLC

(57) ABSTRACT

An amplifier comprises a main amplification stage and an auxiliary amplification stage. An input of the main amplification stage and an input of the auxiliary amplification stage are coupled to a common node, and an output of the main amplification stage is coupled to an output node. During activation, before power is supplied to the main amplification stage, the output node is coupled to a reference voltage ($V_{REF}$). A quiescent voltage is then established at the common node by coupling power to the auxiliary amplification stage. Only then is power coupled to the main amplification stage and the reference voltage ($V_{REF}$) de-coupled from the output node.

12 Claims, 4 Drawing Sheets

AMPLIFIER ACTIVATION

FIELD OF THE DISCLOSURE

The present disclosure relates to activation of an amplifier, and has application in, for example but not exclusively, audio systems such a mobile phone or an MP3 player.

BACKGROUND TO THE DISCLOSURE

If a power supply to an audio amplifier is switched on when a loudspeaker or a headset is already connected to the audio amplifier, a click may be heard due to transient signals occurring as quiescent DC voltages and currents are established in the amplifier. Similarly, a click may be heard when the power supply is switched off, due to transient signals as the quiescent DC voltages and currents decay. These clicks are commonly referred to as "click 'n pop" noise.

In large audio equipment, such "click 'n pop" noises are countered by means of relays which isolate the loudspeaker or headset from the amplifier until after power has been supplied to the amplifier. The use of such relays in small audio equipment is undesirable due to the associated additional cost, control complexity and size, and because they cannot be integrated using standard integrated circuit manufacturing processes. The use of transistors to perform an equivalent switching function can cause distortion. There is a requirement for alternative ways of reducing "click 'n pop" noise.

SUMMARY OF THE PREFERRED EMBODIMENTS

According to a first aspect, there is provided an amplifier comprising: a main amplification stage and an auxiliary amplification stage, wherein an input of the main amplification stage and an input of the auxiliary amplification stage are coupled to a common node, and an output of the main amplification stage is coupled to an output node; first switch means for selectively coupling the output node to a reference voltage; second switch means for selectively coupling power to the auxiliary amplification stage; third switch means for selectively coupling power to the main amplification stage; and a controller arranged to activate the amplifier by controlling the first, second and third switch means, with the third switch means initially de-coupling power to the main amplification stage and the first switch means initially coupling the output node to the reference voltage, in the following sequential order: controlling the second switch means to couple power to the auxiliary amplification stage and to establish a quiescent voltage at the common node; controlling the third switch means to couple power to the main amplification stage; and controlling the first switch means to de-couple the output node from the reference voltage.

According to a second aspect, there is provided a method of activating an amplifier, the amplifier comprising a main amplification stage and an auxiliary amplification stage, wherein an input of the main amplification stage and an input of the auxiliary amplification stage are coupled to a common node, and an output of the main amplification stage is coupled to an output node, and the method comprising, with power initially being de-coupled from the main amplification stage and the output node initially being coupled to a reference voltage, in the following sequential order: coupling power to the auxiliary amplification stage to establish a quiescent voltage at the common node; coupling power to the main amplification stage; and de-coupling the output node from the reference voltage.

Therefore, prior to power-on of the main amplification stage, the output of the main amplification stage can be muted by coupling its output to a reference voltage, and an auxiliary amplification stage can be used to establish a quiescent voltage at the input of the main amplification stage. After power-on of the main amplification stage, the output of the main amplification stage can be de-coupled from the reference voltage, permitting a signal to be delivered to a load coupled to the output. In this way, transient voltages and currents appearing at the output of the main amplification stage during power-on can be reduced or eliminated. The use of the auxiliary amplification stage enables the quiescent voltage to adapt to variations in temperature or to process variations in integrated circuit manufacture.

Optionally, the amplifier comprises: an input node for a signal to be amplified; a first input element coupled between the input node and an intermediate node; a first feedback element coupled between the intermediate node and the output node; an input stage coupled between the intermediate node and the common node; fourth switch means for selectively coupling a second input element between the input node and the intermediate node in parallel with the first input element and selectively coupling a second feedback element between the intermediate node and an output of the auxiliary amplification stage, wherein the controller is arranged to control the fourth switch means to couple the second input element between the input node and the intermediate node in parallel with the first input element and to couple the second feedback element between the intermediate node and an output of the auxiliary amplification stage to establish the quiescent voltage at the common node before controlling the third switch means to couple power to the main amplification stage.

Likewise, in the method, the amplifier can optionally comprise an input node for a signal to be amplified, a first input element coupled between the input node and an intermediate node, a first feedback element coupled between the intermediate node and the output node, and an input stage coupled between the intermediate node and the common node, and establishing a quiescent voltage at the common node may comprise coupling a second input element between the input node and the intermediate node in parallel with the first input element and coupling a second feedback element between the intermediate and an output of the auxiliary amplification stage before coupling power to the main amplification stage.

This feature enables the main amplification stage to be operated with feedback, which can provide enhanced audio performance, by providing the auxiliary amplification stage with an auxiliary feedback arrangement for use in establishing the quiescent voltage.

In some embodiments, the first input element and the second input element may have equal impedance, and the first feedback element and the second feedback element may have equal impedance. In some embodiments, the first input element, first feedback element, second input element and the second feedback element may each be a resistive element.

Optionally, the controller is arranged to control the fourth switching means to de-couple the second input element from at least one of the input node and the intermediate node and to de-couple the second feedback element from at least one of the intermediate node and the output of the auxiliary amplification stage, after de-coupling the output node from the reference voltage.

Likewise, the method can optionally comprise de-coupling the second input element from at least one of the input node and the intermediate node and de-coupling the second feedback element from at least one of the intermediate node and the output of the auxiliary amplification stage, after de-coupling the output node from the reference voltage.

This feature enables amplification by the main amplification stage to proceed unaffected by the auxiliary feedback arrangement.

Optionally, the controller is arranged to control the second switch means to de-couple power from the auxiliary amplification stage after controlling the fourth switching means to de-couple the second input element from at least one of the input node and the intermediate node, and to de-couple the second feedback element from at least one of the intermediate node and the output of the auxiliary amplification stage.

Likewise, the method can optionally comprise de-coupling power from the auxiliary amplification stage after de-coupling the second input element from at least one of the input node and the intermediate node, and de-coupling the second feedback element from at least one of the intermediate node and the output of the auxiliary amplification stage.

This feature enables power to be conserved after the main amplification stage has been powered up.

Optionally, the main amplification stage comprises a main amplifier circuit and the auxiliary amplification stage comprises an auxiliary amplifier circuit, wherein the auxiliary amplifier circuit is a copy of the main amplifier circuit. This feature provides a simple and accurate way of enabling the quiescent voltage established by the auxiliary amplification stage to be at the same level as required by the main amplification stage, thereby contributing to reducing transient signals.

Optionally, the main amplifier circuit comprises at least one first transistor, and wherein the auxiliary amplifier circuit comprises at least one second transistor having at least one physical dimension which is a scaled down copy of at least one physical dimension of the at least one first transistor. This feature can enable the auxiliary amplifier to establish a quiescent voltage for the main amplifier whilst consuming less power in the auxiliary amplifier and occupying less integrated circuit chip area than in the main amplifier.

Optionally, the main amplifier circuit comprises a first p-channel metal oxide semiconductor transistor and a first n-channel metal oxide semiconductor transistor with their gates coupled to an input of the main amplifier circuit and their drains coupled to an output of the main amplifier circuit, and the auxiliary amplifier circuit comprises a second p-channel metal oxide semiconductor transistor and a second n-channel metal oxide semiconductor transistor with their gates coupled to an input of the auxiliary amplifier circuit and their drains coupled to an output of the auxiliary amplifier circuit. This feature can enable a simple implementation of the main amplifier and the auxiliary amplifier.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
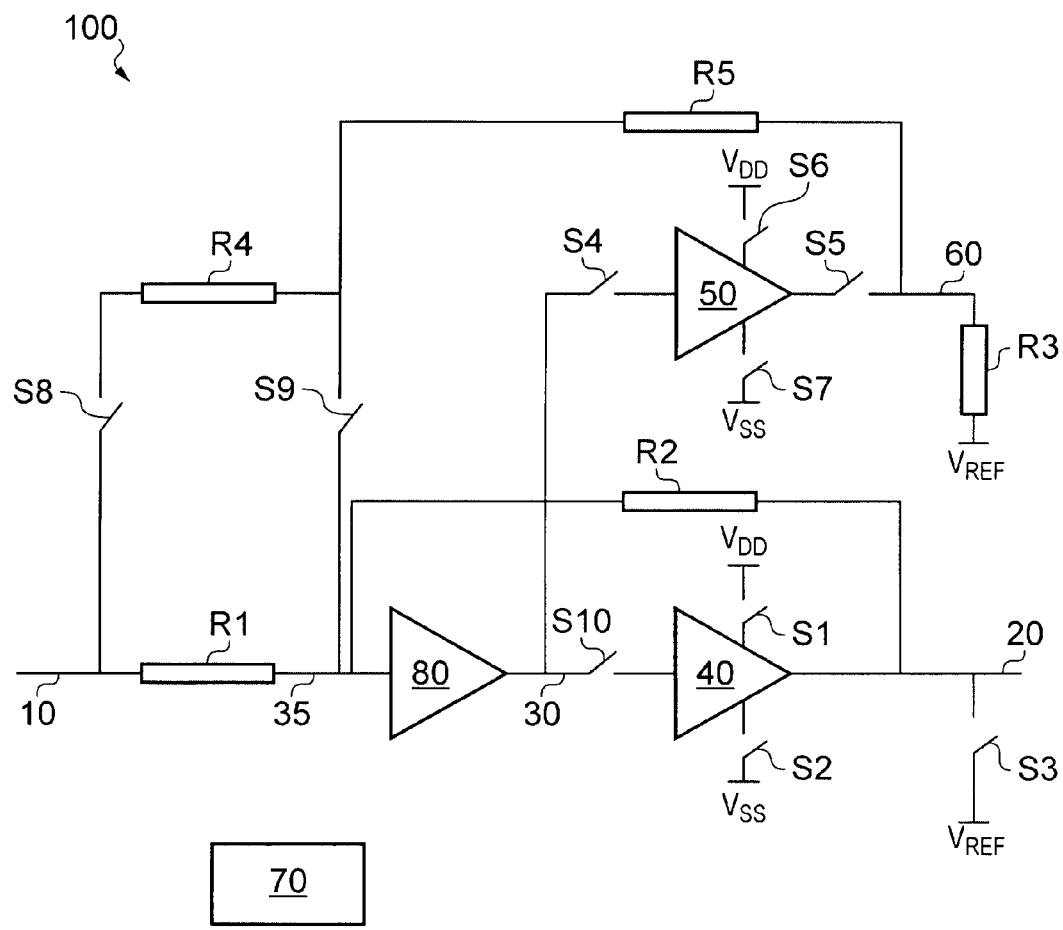
FIG. 1 is a block schematic diagram of a first embodiment of an amplifier.

Referring to FIG. 1, in a first embodiment, an amplifier 100 has an input node 10 for a signal to be amplified and an output node 20 for coupling to a load and for delivering the signal to the load after amplification by the amplifier 100. The amplifier 100 also has a common node 30 and a main amplification stage 40, having an input coupled to the common node 30 by means of a tenth switch S10 and an output coupled to the output node 20 of the amplifier 100. The main amplification stage 40 is coupled to first supply rail supplying a first voltage $V_{DD}$ by means of a first switch S1, and to a second supply rail supplying a lower second voltage $V_{SS}$ by means of a second switch S2. The output of the main amplification stage 40 is coupled to a reference voltage $V_{REF}$ by means of a third switch S3. The reference voltage $V_{REF}$ is, in this embodiment, equal to the average of the first and second voltages, $(V_{DD}+V_{SS})/2$, or is at least close to this value. Coupled between the input node 10 and an intermediate node 35 is a first resistive element R1, and coupled between the intermediate node 35 and the output of the main amplification stage 40 is a second resistive element R2. An input stage 80 has an input coupled to the intermediate node 35 and an output coupled to the common node 30.

The amplifier 100 has an auxiliary amplification stage 50, having an input coupled to the common node 30 by means of a fourth switch S4 and an output coupled to an auxiliary output 60 by means of a fifth switch S5. The auxiliary output 60 is coupled to the reference voltage $V_{REF}$ by means of an auxiliary load R3. The use of the auxiliary load R3 is optional, but it may improve the performance of the amplifier 100 by reducing fluctuations in voltage at the auxiliary output 60, and consequently reducing fluctuations in voltage at the common node 30. Alternatively, the auxiliary output 60 need not be coupled to the reference voltage $V_{REF}$. If used, the auxiliary load R3 may be chosen to have an impedance equal to the impedance of the load to be coupled to the output node 20. The auxiliary amplification stage 50 is coupled to the first supply rail supplying the voltage $V_{DD}$ by means of a sixth switch S6, and to the second supply rail supplying the voltage $V_{SS}$ by means of a seventh switch S7. A fourth resistive element R4 has a first terminal coupled to the input node 10 by means of an eighth switch S8, and a second terminal coupled to the intermediate node 35 by means of a ninth switch S9. A fifth resistive element R5 has a first terminal coupled to the second terminal of the fourth resistive element R4, and a second terminal coupled to the auxiliary output 60. The amplifier 100 also has a controller 70 for controlling the first to tenth switches S1-S10.

Figure 2:
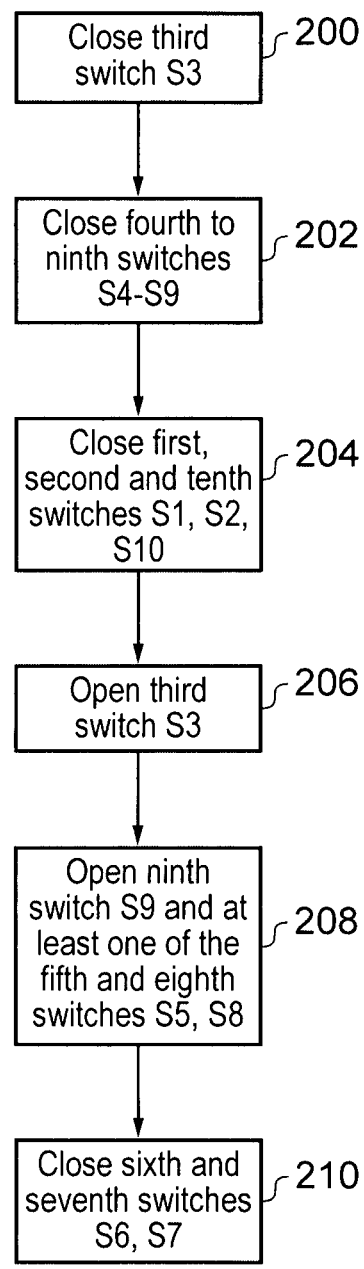
FIG. 2 is a flow chart of a method of activating the amplifier.

Referring to FIG. 2, activation, or powering up, of the amplifier 100 begins from an initial state in which the first to tenth switches S1-S10 are open, that is, in a non-conducting state. It is assumed that the main amplification stage 40 is identical to the auxiliary amplification stage 50, that the first resistive element R1 and the fourth resistive element R4 are equal in value, and that the second resistive element R2 and the fifth resistive element R5 are equal in value, although deviations from these assumptions are discussed below.

At step 200, the controller 70 closes the third switch S3, thereby coupling the output node 20 to the reference voltage $V_{REF}$.

At step 202, the controller 70 closes fourth to ninth switches S4-S9, resulting in power being applied to the auxiliary amplification stage 50 from the first and second supply rails. Consequently, current flows in the auxiliary amplification stage 50 and in the fourth and fifth resistive elements R4, R5, and a quiescent voltage is established at the common node 30. At this time, the auxiliary amplification stage 50 and the fifth resistive element R5 are operating in a first feedback loop.

At step 204, the controller 70 closes the first, second and tenth switches S1, S2, S10 resulting in power being applied to the main amplification stage 40 from the first and second supply rails and in the input of the main amplification stage 40 being coupled to the common node 30. Due to the auxiliary amplification stage 50 being a copy of the main amplification stage 40, and the equality of the first and fourth resistive elements R1, R4 and of the second and fifth resistive elements R2, R5, the main amplification stage 40 and the first and second resistive elements R1, R2 will tend to establish the same quiescent voltage at the common node 30 as already established by the auxiliary amplification stage 50 in conjunction with the fourth and fifth resistive elements R4, R5. In practice, there may be a transient voltage as the main amplification stage 40 starts to conduct current due to, for example, mismatch of transistor parasitic capacitance or load in the main amplification stage 40. However, this transient voltage is at least minimal due to the third switch S3 coupling the output node 20 to the reference voltage $V_{REF}$.

At step 206, the controller 70 opens the third switch S3. At this time, the main amplification stage 40 and the second resistive element R2 are operating in a second feedback loop, simultaneously to the operation of the first feedback loop of the auxiliary amplification stage 50 and the fifth resistive element R5.

At step 208, the controller 70 breaks the first feedback loop by opening the ninth switch S9, to prevent the first feedback loop from affecting the subsequent operation of the main amplification stage 40. In addition at step 208, to avoid the fourth and fifth resistive elements R4, R5 affecting the subsequent operation of the main amplification stage 40, the controller 70 opens at least one of the fifth and eighth switches S5, S8. Indeed, in a variant of the amplifier 100, either the fifth switch S5 or the eighth switch S8 may be omitted, being replaced by a direct coupling, equivalent to maintaining one of the fifth and eighth switches S5, S8 in the closed position. In this state, the amplifier 100 is able to amplify in the main amplification stage 40 signals received at the input node 10 and deliver the amplified signal at the output node 20, although this is also possible after step 206 if the third resistive element R3 is equal to the load at the output node 20 and if the auxiliary amplification stage 50 is equal to the main amplification stage 40.

At this time, it is advantageous to proceed to deactivate the auxiliary amplification stage 50 in order to reduce power consumption. Therefore, at optional step 210, controller 70 opens the sixth and seventh switches S6, S7 so that the auxiliary amplification stage 50 is de-coupled from the first and second supply rails. Also at step 210, the tenth switch S10 may be opened if necessary to prevent the auxiliary amplification stage 50 from affecting subsequent operation of the main amplification stage 40.

The purpose of the input stage 80 is to provide the signal in a suitable form for driving the main amplification stage 40, and, if desired, amplify the signal. However, in some embodiments the input stage 80 may be dispensed with, in which case the intermediate node 35 and the common node 30 are the same node.

Figure 3:
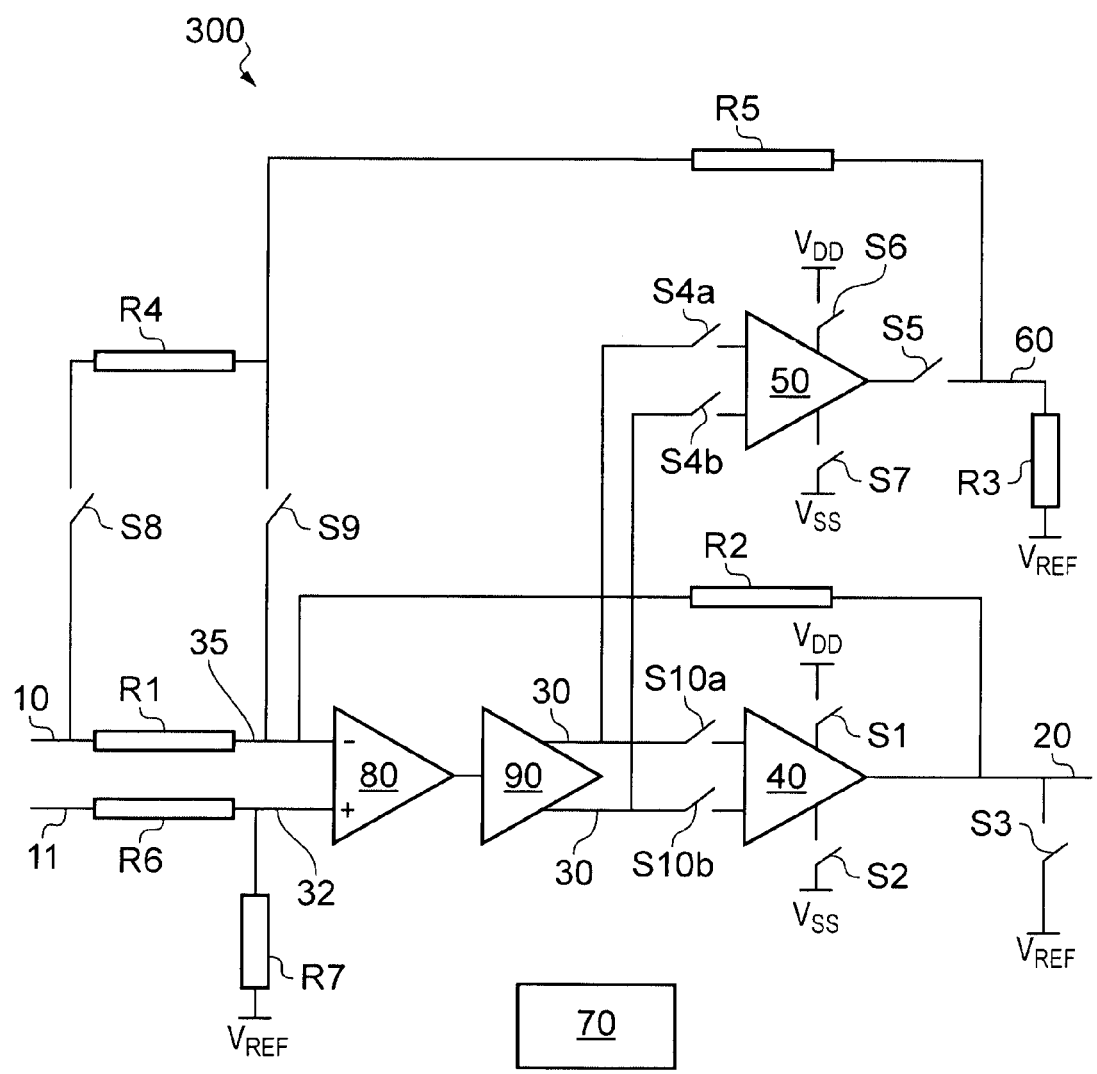
FIG. 3 is a block schematic diagram of a second embodiment of an amplifier.

Referring to FIG. 3, a second embodiment an amplifier 300 is similar to that of the first embodiment. Elements of the amplifier 300 illustrated in FIG. 3 that have the same reference numeral as elements of the amplifier 100 illustrated in FIG. 1 are the same and operate in the same way, so are not be described again. Only the differences between the amplifier 300 illustrated in FIG. 3 and the amplifier 100 illustrated in FIG. 1 are described below.

The amplifier 300 illustrated in FIG. 3 differs from the amplifier 100 illustrated in FIG. 1 by the provision for a differential input signal by providing the input stage 80 with a differential input, and by the inclusion of a driver stage 90 coupled between the output of the input stage 80 and the common node 30. Also, the driver stage 90 provides a pair of drive signals at the input of the main amplification stage 40 and at the input of the auxiliary amplification stage 50.

A signal to be amplified by the amplifier 300 is applied in a differential format comprising complementary signal components. One of the signal components is applied at the input node 10, and the other signal component is applied at a complementary input 11. The input node 10 is coupled by means of the first resistive element R1 to an inverting input of the input stage 80, the inverting input also being coupled to the intermediate node 35. The complementary input 11 is coupled by means of a sixth resistive element R6 to a non-inverting input of the input stage 80. The non-inverting input of the input stage 80 is coupled to the reference voltage $V_{REF}$ by means of a seventh resistive element R7.

A single ended output of the input stage 80 is coupled to an input of the driver stage 90. An output of the driver stage 90 delivers to the common node 30 dual drive signals suitable for driving the main amplification stage 40 and the auxiliary amplification stage 50. The output of the driver stage 90 is coupled via the common node 30 to the input of the auxiliary amplification stage 50, which has a dual format for receiving the dual drive signals, by means of a dual fourth switch S4a, S4b, in place of the fourth switch S4 in the amplifier 100 illustrated in FIG. 1. The output of the driver stage 90 is also coupled via the common node 30 to the input of the main amplification stage 40, which also has a dual format for receiving the dual drive signals, by means of a dual tenth switch S10a, S10b in place of the tenth switch S10 in the amplifier 100 illustrated in FIG. 1. In the amplifier 300 illustrated in FIG. 3, the controller 70 controls the dual fourth switch S4a, S4b instead of the fourth switch S4 of the amplifier 100 of FIG. 1, and controls the dual tenth switch S10a, S10b instead of the tenth switch S10 of the amplifier of FIG. 1.

The description of the operation of the amplifier 100 illustrated in FIG. 1 with reference to the flow chart of FIG. 2 is applicable also to the amplifier 300 illustrated in FIG. 3, with the proviso that the dual fourth switch S4a, S4b, rather than the fourth switch S4, and the dual tenth switch S10a, S10b, rather than the tenth switch S10, are controlled and are assumed to be open in the initial state. The input stage 80 and the driver stage 90 are supplied with power at step 202 in order to supply the dual drive signals to the auxiliary amplification stage 50. The input stage 80 and the driver stage 90 remain supplied with power when the main amplification stage 40 is supplied with power in order to supply the dual drive signals to the main amplification stage 40.

Figure 4:
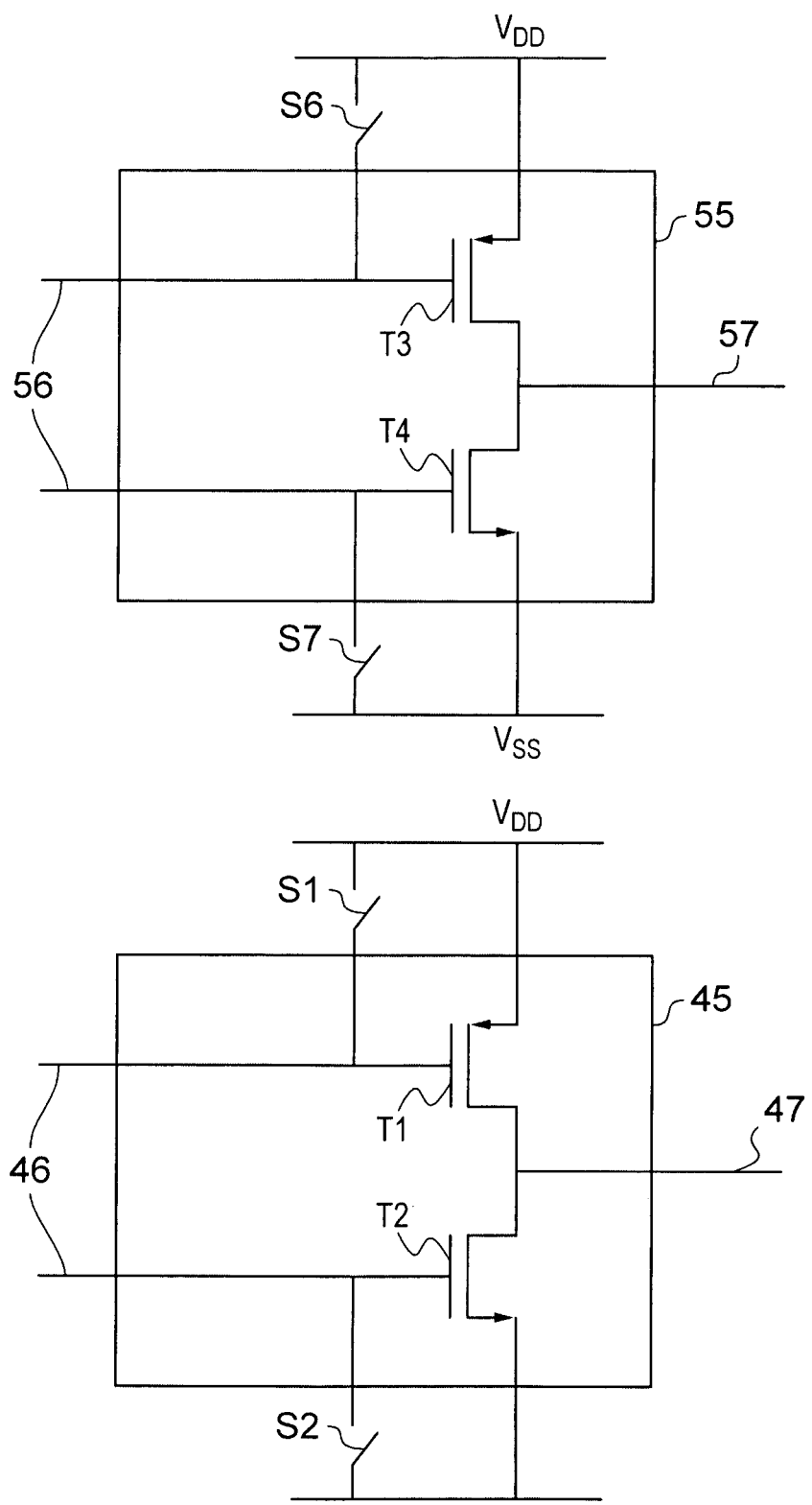
FIG. 4 is a circuit schematic diagram of an amplifier circuit and of a copy of the amplifier circuit.

Referring to FIG. 4, the main amplification stage 40 includes a main amplifier circuit 45 and the auxiliary amplification stage 50 includes an auxiliary amplifier circuit 55. The main amplifier circuit 45 comprises p-channel metal oxide semiconductor (PMOS) transistor T1 and an n-channel metal oxide semiconductor (NMOS) transistor T2 having their drains coupled to an output 47 of the main amplifier circuit 45. A dual input 46 of the main amplifier circuit 45 couples to the gates of the PMOS and NMOS transistors T1, T2 for delivering the drive signals from the driver stage 90 to the PMOS and NMOS transistors T1, T2. The source of the PMOS transistor T1 is coupled to the first supply rail providing the first voltage $V_{DD}$, and the source of the NMOS transistor T2 is coupled to the second supply rail providing the second voltage $V_{SS}$.

FIG. 4 illustrates an alternative configuration of the first, second sixth and seventh switches S1, S2, S6, S7 which, in contrast to the configuration illustrated in FIG. 1, enables power to be delivered to the main amplifier circuit 45 and the auxiliary amplifier circuit 55 when these switches are open, rather than closed. Coupled between the gate of the PMOS transistor T1 and the first supply rail providing the voltage $V_{DD}$ is the first switch S1, and coupled between the gate of the NMOS transistor T2 and the second supply rail providing the voltage $V_{SS}$ is the second switch S2. The flow of power to the main amplifier circuit 45 is enabled by opening the first and second switches S1, S2, enabling the PMOS and NMOS transistors T1, T2 to conduct current between their drains and sources. The flow of power to the main amplifier circuit 45 is inhibited by closing the first and second switches S1, S2, thereby coupling the gates to the supply voltages $V_{DD}$ and $V_{SS}$ and inhibiting the flow of current between the drains and sources of the PMOS and NMOS transistors T1, T2.

The auxiliary amplifier circuit 55 has a structure identical to the main amplifier circuit 45. A PMOS transistor T3 is a copy of the PMOS transistor T1, and an NMOS transistor T4 is a copy of the NMOS transistor T2. The drains of the PMOS and NMOS transistors T3, T4 are coupled to an output 57 of the auxiliary amplifier circuit 55. A dual input 56 of the auxiliary amplifier circuit 55 couples with the gates of the PMOS and NMOS transistors T3, T4 for delivering the drive signals from the driver stage 90 to the PMOS and NMOS transistors T3, T4. The source of the PMOS transistor T3 is coupled to the first supply rail providing the first voltage $V_{DD}$, and the source of the NMOS transistor T4 is coupled to the second supply rail providing the second voltage $V_{SS}$. Coupled between the gate of the PMOS transistor T3 and the first supply rail providing the first voltage $V_{DD}$ is the sixth switch S6, and coupled between the gate of the NMOS transistor T4 and the second supply rail providing the second voltage $V_{SS}$ is the seventh switch S7. The flow of power to the auxiliary amplifier 55 is enabled by opening the sixth and seventh switches S6, S7, enabling the PMOS and NMOS transistors T3, T4 to conduct current between their drains and sources. The flow of power to the auxiliary amplifier 55 is inhibited by closing the sixth and seventh switches S6, S7, thereby coupling the gates to the supply voltages $V_{DD}$ and $V_{SS}$ and inhibiting the flow of current between the drains and sources of the PMOS and NMOS transistors T3, T4.

The main amplifier circuit 45 and the auxiliary amplifier circuit 55 each operate in class AB when supplied with power and the drive signals. Alternatively, other classes of operation could be used, such as class A or class G.

For use with the amplifier 100 illustrated in FIG. 1, the main amplification stage 40 and the auxiliary amplification stage 50 include a driver stage to generate the dual drive signals required by the main amplifier circuit 45 and the auxiliary amplifier circuit 55, or alternatively a driver stage may be provided between the intermediate node 35 and the common node 30 of the amplifier 100 illustrated in FIG. 1.

Preferably, at least part of the auxiliary amplifier circuit 55 is a copy of the main amplifier circuit 45. Indeed, the auxiliary amplification stage 50 can be a copy of the main amplification stage 40. In particular, preferably the PMOS transistor T3 of the auxiliary amplifier circuit 55 is a copy of the PMOS transistor T1 of the main amplifier circuit 45, and the NMOS transistor T4 of the auxiliary amplifier circuit 55 is a copy of the NMOS transistor T2 of the main amplifier circuit 45. Such copies may be scaled down copies. For example, at least one of the physical dimensions of the PMOS transistor T3 of the auxiliary amplifier circuit 55 may be a scaled down copy of at least one of the physical dimensions of the PMOS transistor T1 of the main amplifier circuit 45, and at least one of the physical dimensions of the NMOS transistor T4 of the auxiliary amplifier circuit 55 may be a scaled down copy of at least one of the physical dimensions of the NMOS transistor T2 of the main amplifier circuit 45. In one embodiment, the scaling down is by a factor of four in the width of the PMOS transistor T3 and the NMOS transistor T4, with the length of these transistors being equal to the length of the PMOS transistor T1 and the NMOS transistor T2 respectively. If the PMOS and NMOS transistors T3, T4 of the auxiliary amplifier circuit 55 are scaled down copies of the PMOS and NMOS transistors T1, T2 of the main amplifier circuit 45, then the auxiliary load R3, if used, should preferably have an impedance corresponding to the impedance of the load to be coupled to the output node 20, but scaled up by the same, or similar scale factor, in order to reduce the current proportionally.

The use of such copies, whether scaled down copies or copies of equal size, means that the quiescent operating voltage established at the common node 30 by the auxiliary amplifier circuit 55 is equal to the quiescent operating voltage at the common node 30 when main amplification stage circuit 45 is operational, delivering an amplified signal to the load coupled to the output node 20. This enables transients at the output node 20 due to activation of the main amplification stage 45 during steps 204 and 206 in FIG. 2 to be minimised. Nevertheless, even the use of an auxiliary amplifier circuit 55 that is not a copy of the main amplifier circuit 45 can provide a quiescent operating voltage at the common node 30 that will contribute to reducing the occurrence of transients at the output node 20.

Although embodiments have been described in which the first and fourth resistive elements R1, R4 have equal resistance, and the second and fifth resistive elements R2, R5 have equal resistance, this is not essential. Such equality can enable the occurrence of transients at the output node 20 to be minimised, but even non-equal values can contribute to reducing transients.

The configuration of switches in the embodiments illustrated in FIGS. 1, 3 and 4 are examples only, and alternative configurations of switches may be used, as demonstrated for the first, second, fifth, sixth, seventh and eighth switches S1, S2, S5, S6, S7, S8. Furthermore, in some embodiments, the fourth switch S4, or correspondingly the dual fourth switch S4a, S4b may be omitted, being replaced by a direct connection corresponding to the closed state of these switches, if de-coupling the supply of power from the auxiliary amplification stage 50 is sufficient to prevent the auxiliary amplification stage 50 from affecting the operation of the main amplification stage 40. Correspondingly, in some embodiments, the tenth switch S10, or correspondingly the dual tenth switch S10a, S10b may be omitted, being replaced by a direct connection corresponding to the closed state of these switches, if de-coupling the supply of power from the main amplification stage 40 is sufficient to prevent the main amplification stage 40 from affecting the operation of the auxiliary amplification stage 50.

The first to tenth switches S1-10 may be implemented, for example, using semiconductor devices, and need not open and close instantaneously but have a gradual transition in impedance. In particular, any or all the third switch S3, the fifth switch S5 and the eighth switch S8 may have a gradual transition in impedance from a conducting state, having a zero or low impedance, to a non-conducting state, having an infinite or very high impedance. The duration of the transition may be dependent on the bandwidth of the amplifier 100, 300. For example, the duration of the transition may exceed 1/B, where B is the bandwidth of the amplifier 100, 300. The gradual transition between the conducting and non-conducting states can reduce the occurrence of undesirable transient noise in the amplifier 100, 300.

Although embodiments have been described in which the first and second switches S1, S2 are external to the main amplification stage 40 and in which the sixth and seventh switches S6, S7 are external to the auxiliary amplification stage 50, this is not essential and alternatively either or both of first and second switches S1, S2 may be external to the main amplification stage 40 and/or either or both the sixth and seventh switches S6, S7 may be external to the auxiliary amplification stage 50.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. An amplifier comprising:
    a main amplification stage and an auxiliary amplification stage, wherein an input of the main amplification stage and an input of the auxiliary amplification stage are coupled to a common node, and an output of the main amplification stage is coupled to an output node; and
    first switch means for selectively coupling the output node to a reference voltage;
    second switch means for selectively coupling power to the auxiliary amplification stage;
    third switch means for selectively coupling power to the main amplification stage; and
    a controller arranged to activate the amplifier by controlling the first, second and third switch means, with the third switch means initially de-coupling power to the main amplification stage and the first switch means initially coupling the output node to the reference voltage, in the following sequential order:
        controlling the second switch means to couple power to the auxiliary amplification stage and to establish a quiescent voltage at the common node:
        controlling the third switch means to couple power to the main amplification stage; and
        controlling the first switch means to de-couple the output node from the reference voltage.

2. An amplifier as claimed in claim 1, comprising:
    an input node for a signal to be amplified;
    a first input element coupled between the input node and an intermediate node;
    a first feedback element coupled between the intermediate node and the output node;
    an input stage coupled between the intermediate node and the common node;
    fourth switch means for selectively coupling a second input element between the input node and the intermediate node in parallel with the first input element and selectively coupling a second feedback element between the intermediate node and an output of the auxiliary amplification stage, wherein the controller is arranged to control the fourth switch means to couple the second input element between the input node and the intermediate node in parallel with the first input element and to couple the second feedback element between the intermediate node and an output of the auxiliary amplification stage to establish the quiescent voltage at the common node before controlling the third switch means to couple power to the main amplification stage.

3. An amplifier as claimed in claim 2, wherein the first input element and the second input element have equal impedance, and the first feedback element and the second feedback element have equal impedance.

4. An amplifier as claimed in claim 2, wherein the controller is arranged to control the fourth switching means to de-couple the second input element from at least one of the input node and the intermediate node and to de-couple the second feedback element from at least one of the intermediate node and the output of the auxiliary amplification stage, after de-coupling the output node from the reference voltage.

5. An amplifier as claimed in claim 4, wherein the controller is arranged to control the second switch means to de-couple power from the auxiliary amplification stage after controlling the fourth switching means to de-couple the second input element from at least one of the input node and the intermediate node, and to de-couple the second feedback element from at least one of the intermediate node and the output of the auxiliary amplification stage.

6. An amplifier as claimed in any preceding claim, wherein the main amplification stage comprises a main amplifier circuit and the auxiliary amplification stage comprises an auxiliary amplifier circuit, wherein the auxiliary amplifier circuit is a copy of the main amplifier circuit.

7. An amplifier as claimed in claim 6, wherein the main amplifier circuit comprises at least one first transistor, and wherein the auxiliary amplifier circuit comprises at least one second transistor having at least one physical dimension which is a scaled down copy of at least one physical dimension of the at least one first transistor.

8. An amplifier as claimed in claim 6, wherein the main amplifier circuit comprises a first p-channel metal oxide semiconductor transistor and a first n-channel metal oxide semiconductor transistor with their gates coupled to an input of the main amplifier circuit and their drains coupled to an output of the main amplifier circuit, and wherein the auxiliary amplifier circuit comprises a second p-channel metal oxide semiconductor transistor and a second n-channel metal oxide semiconductor transistor with their gates coupled to an input of the auxiliary amplifier circuit and their drains coupled to an output of the auxiliary amplifier circuit.

9. A method of activating an amplifier, the amplifier comprising a main amplification stage and an auxiliary amplification stage, wherein an input of the main amplification stage and an input of the auxiliary amplification stage are coupled to a common node, and an output of the main amplification stage is coupled to an output node, and the method comprising, with power initially being de-coupled from the main amplification stage and the output node initially being coupled to a reference voltage, in the following sequential order:
    coupling power to the auxiliary amplification stage to establish a quiescent voltage at the common node;

coupling power to the main amplification stage; and
de-coupling the output node from the reference voltage.

10. A method of activating an amplifier as claimed in claim 9, the amplifier comprising an input node for a signal to be amplified, a first input element coupled between the input node and an intermediate node, a first feedback element coupled between the intermediate node and the output node, and an input stage 80 coupled between the intermediate node and the common node, wherein establishing a quiescent voltage at the common node comprises coupling a second input element between the input node and the intermediate node in parallel with the first input element and coupling a second feedback element between the intermediate node and an output of the auxiliary amplification stage before coupling power to the main amplification stage.

11. A method of activating an amplifier as claimed in claim 10, comprising de-coupling the second input element from at least one of the input node and the intermediate node and de-coupling the second feedback element from at least one of the intermediate node and the output of the auxiliary amplification stage, after de-coupling the output node from the reference voltage.

12. A method of activating an amplifier as claimed in claim 11, comprising de-coupling power from the auxiliary amplification stage after de-coupling the second input element from at least one of the input node and the intermediate node and de-coupling the second feedback element from at least one of the intermediate node and the output of the auxiliary amplification stage.

* * * * *